United States Patent [19]

Mallik et al.

[11] Patent Number: 5,420,461
[45] Date of Patent: May 30, 1995

[54] INTEGRATED CIRCUIT HAVING A TWO-DIMENSIONAL LEAD GRID ARRAY

[75] Inventors: Debendra Mallik; Bidyut K. Bhattacharyya, both of Chandler, Ariz.

[73] Assignee: Intel Corporation, Santa Clara, Calif.

[21] Appl. No.: 225,420

[22] Filed: Apr. 7, 1994

Related U.S. Application Data

[60] Continuation of Ser. No. 12,031, Feb. 1, 1993, abandoned, which is a division of Ser. No. 870,542, Apr. 17, 1992, Pat. No. 5,210,939.

[51] Int. Cl.⁶ .................... H01L 23/48; H01L 29/40; H01L 23/02; H01L 23/12
[52] U.S. Cl. .................................. 257/734; 257/696; 257/785; 361/769; 361/772; 361/776
[58] Field of Search .............. 257/735, 695, 696, 711, 257/785, 778, 747, 737, 734, 693, 697, 669; 361/769, 772, 776

[56] References Cited

U.S. PATENT DOCUMENTS

| | | | |
|---|---|---|---|
| 3,242,555 | 3/1966 | Weber | 29/155.5 |
| 3,597,658 | 8/1971 | Rivera | 317/234 R |
| 3,700,788 | 10/1972 | Spurck | 361/776 |
| 3,812,402 | 5/1974 | Garth | 174/15 |
| 3,842,189 | 10/1974 | Southgale | 361/776 |
| 4,331,831 | 5/1982 | Ingram et al. | 174/52 FP |
| 4,607,276 | 8/1986 | Butt | 257/778 |
| 4,689,875 | 9/1987 | Solstad | 437/211 |
| 4,751,199 | 6/1988 | Phy | 437/209 |
| 4,864,079 | 9/1989 | Barlow | 174/52.1 |
| 4,920,074 | 4/1990 | Shimizu et al. | 437/211 |
| 4,989,009 | 1/1991 | Hawkins | 257/747 |
| 5,109,269 | 4/1992 | Holzman | 257/666 |

*Primary Examiner*—Rolf Hille
*Assistant Examiner*—T. M. Arroyo
*Attorney, Agent, or Firm*—Blakely, Sokoloff, Taylor & Zafman

[57] ABSTRACT

An integrated circuit device having an array of flexible leads attached to the bottom of an integrated circuit package. There is provided a sheet of electrically conductive material. A plurality of slots are punched into the sheet, such that there is formed a plurality of beams. The beams are then bent into a spring shape. The sheet is placed over an integrated circuit package which has an array of contact pads extending across a bottom surface of the package. The beams are aligned and attached to the contact pads. The beams are then cut and separated from the remainder of the sheet. The sheet is removed, wherein there is constructed an integrated circuit package that has a two dimensional array of flexible leads.

3 Claims, 4 Drawing Sheets

INTEGRATED CIRCUIT HAVING A TWO-DIMENSIONAL LEAD GRID ARRAY

This is a continuation of application Ser. No. 08/012,031, filed Feb. 1, 1993, now abandoned, which is a divisional of application Ser. No. 07/870,542, filed Apr. 17, 1992, now U.S. Pat. No. 5,210,939.

BACKGROUND OF THE INVENTION

1. Field of the Invention

The present invention relates to a method of attaching a two dimensional array of leads to the bottom of an integrated circuit package.

2. Description of Related Art

Integrated circuits (Its) are typically housed within a ceramic or plastic package that is mounted onto a printed circuit board (PCB). The packages have a plurality of leads that are soldered to surface pads on the printed circuit board, to electrically couple the ICs to the board. There are two common types of chip packages, quad flat packs (QFP) and land stud arrays (SGA). Quad flat packs have leads extending from the sides of the package. The leads are typically gull winged (S shaped) and extend around the entire perimeter of the package. The gull wing shape provides flexibility in the leads, which compensates for thermal expansion between the package and the printed circuit board.

As IC's become larger, more leads are required for each package. Increasing the pin count on a quad flat pack, requires either an increase in the size of the package, or a decrease in the spacing between the leads. Increasing the size of the package enlarges the footprint on the card and can expand the overall size of the system. Because of manufacturing tolerances, the reduction of lead spacing typically requires the use of thinner leads. Leads of smaller diameter are subject to higher stresses and failure from vibration, fatigue or shock. Additionally, it is also more difficult to solder the smaller leads to the pads of the circuit board.

Stud grid array packages typically have a two dimensional array of leads extending from the bottom of the package. Although SGA packages provide a high pin count, the leads are straight and rigid. Chip packages typically have a different coefficient of thermal expansion than the board. When the assembly is subjected to temperature changes, the package expands at a different rate than the board. This thermal expansion mismatch induces stresses in the leads, which can cause fatigue and failure at the solder joints. Additionally, the leads of a SGA package are mounted perpendicular to the circuit board. Such an assembly requires coplanarity between the board and the leads. If some leads are shorter than others, the short leads will not make contact with the board, leading to the formation of an inferior solder joint. It is therefore desirable to have a chip package that provides the lead flexibility of a quad flat pack and the high pin count of a SGA package.

SUMMARY OF THE INVENTION

The present invention is a method for attaching an array of flexible leads to the bottom of an integrated circuit package. There is provided a sheet of electrically conductive material. A plurality of slots are punched into the sheet, such that there is formed a plurality of beams. The beams are then bent into a spring shape. The sheet is placed over an integrated circuit package which has an array of contact pads extending across a bottom surface of the package. The beams are aligned and attached to the contact pads. The beams are then cut and separated from the remainder of the sheet. The sheet is removed, wherein there is constructed an integrated circuit package that has a two dimensional array of flexible leads. The package can be mounted onto a circuit board by soldering the leads to surface pads of the board. The two dimensional array provides a high pin count, while the spring shaped leads provide flexibility to compensate for thermal expansion and lack of coplanarity between the leads and the board.

Therefore it is an object of this invention to provide an integrated circuit package that has a two dimensional array of flexible leads.

It is also an object of this invention to provide an integrated circuit package that is rugged and has a high pin count.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
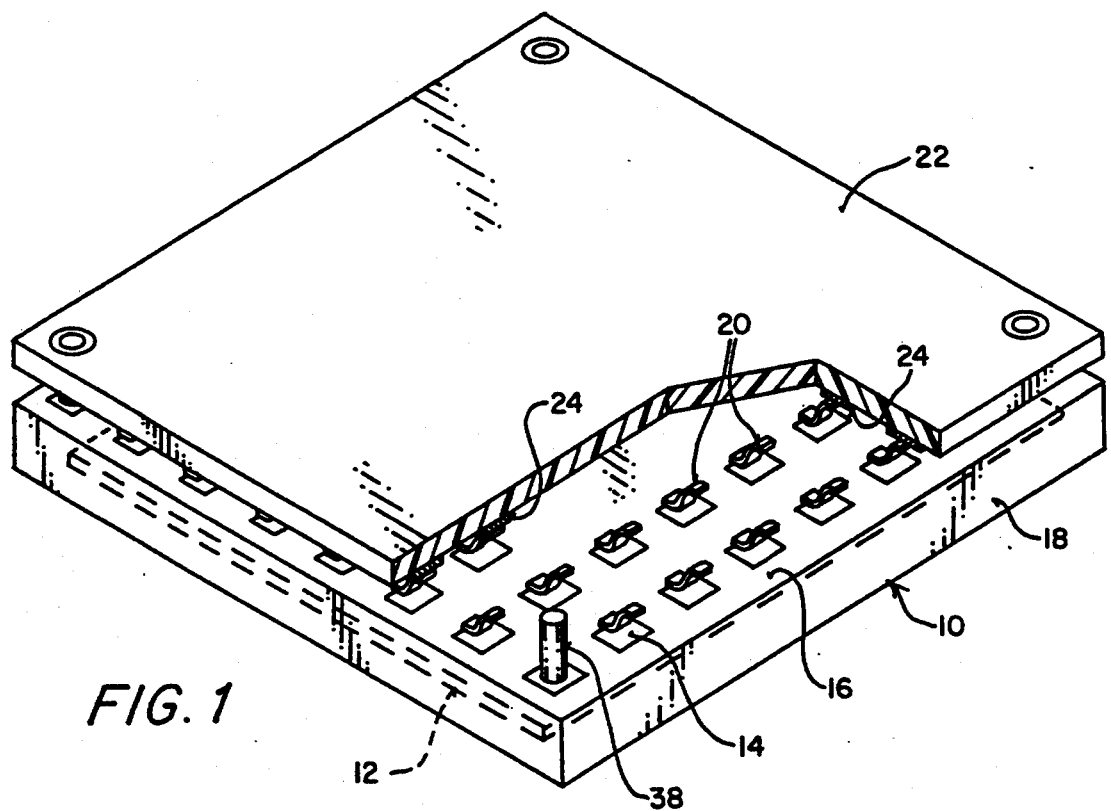
FIG. 1 is a perspective view of an integrated circuit package of the present invention with a printed circuit board.
Figure 2:
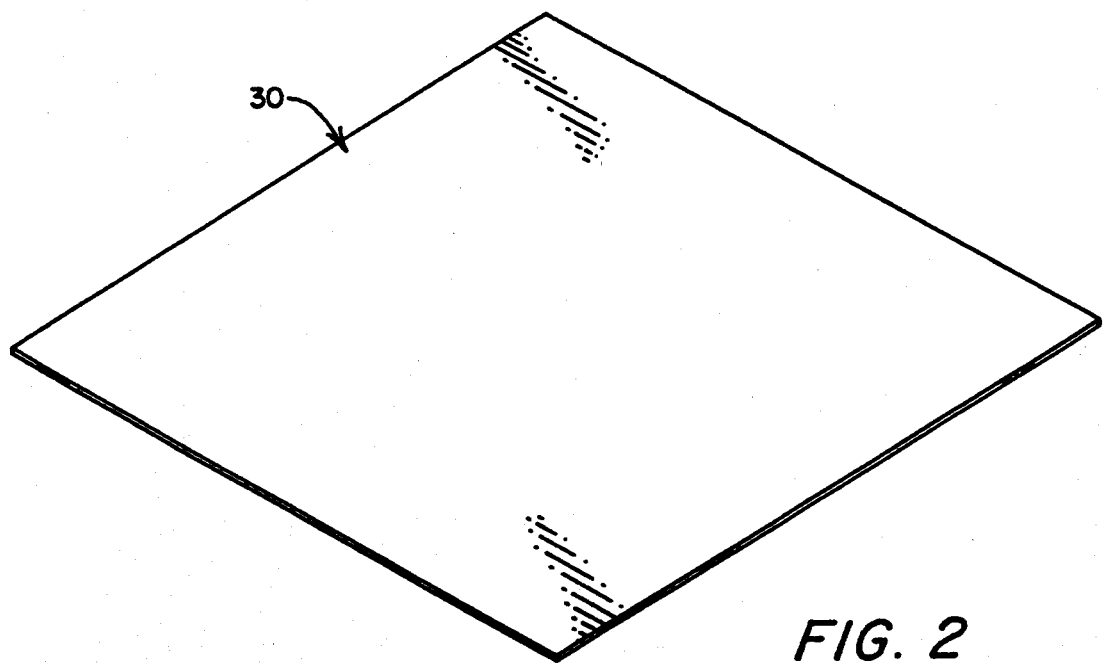
FIG. 2 is a perspective view of an electrically conductive sheet.

Referring to the drawings more particularly by reference numbers, FIG. 1 shows an integrated circuit package 10 of the present invention. The integrated circuit package 10 typically contains an integrated circuit 12 which has a number of pins (not shown) that are electrically coupled to external contact pads 14 on the bottom surface 16 of a module 18. The module 18 is typically constructed from a dielectric ceramic or plastic, the contact pads 14 are typically constructed from copper plated with gold. The contact pads 14 are preferably arranged in a two dimensional linear array. Although a two dimensional linear array is described and shown, it it to be understood that any pattern of pads 14 may be utilized.

Attached to each contact pad 14 is a bent lead 20. The leads 20 are preferably constructed from gold plated copper and have one end attached to the contact pads 14. The leads 20 are bent into a S shape, so that the leads 20 will bend when a force is applied to the leads 20 in a direction perpendicular to the bottom surface 16. The leads 20 electrically couple the integrated circuit 12 to a printed circuit board 22. The printed circuit board 22 has a plurality of surface pads 24 arranged in a manner to match the pattern of the contact pads 14 of the module 18. The surface pads 24 are typically coupled to routing lines (not shown) that provide interconnect for the board 22.

The integrated circuit package 10 is mounted onto a circuit board 22 by means known in the art. The module 18 is placed on the board 22 so that the leads 20 are aligned with the surface pads 24. The pads 24 and/or leads 20 may be coated with a solder or solder paste that is applied before the placement of the module 18. A pressure is applied to either the module 18 or board 22, to push the leads 20 into contact with the surface pads 24. The pressure can be applied by a pressure bar (not shown) or any other means. The spring like characteristic of the leads 20 compensates for any lack of coplanarity between the ends of the leads 20 and the surface pads 24. If some leads 20 are shorter than others, then the pressure will deflect some of the leads, while the shorter leads are brought into contact with, or at least in close proximity to, the surface pads 24. While the pressure is still applied, the leads 20 are soldered to the surface pads 24. The soldering process can be performed by exposing the board 22 and package 10 to a wave solder machine or any other soldering technique known in the art. The pressure is removed, wherein the package 10 is soldered to the board 22. Providing flexible leads 20 improves the solder joints and overall reliability of the entire board assembly. Additionally, the bent leads 20 provide stress relief to compensate for the different thermal expansion rates of the circuit board 22 and the module 18. The leads of the present invention are therefore subjected to lower stress and fatigue than the straight pins found in the art.

Figure 3:
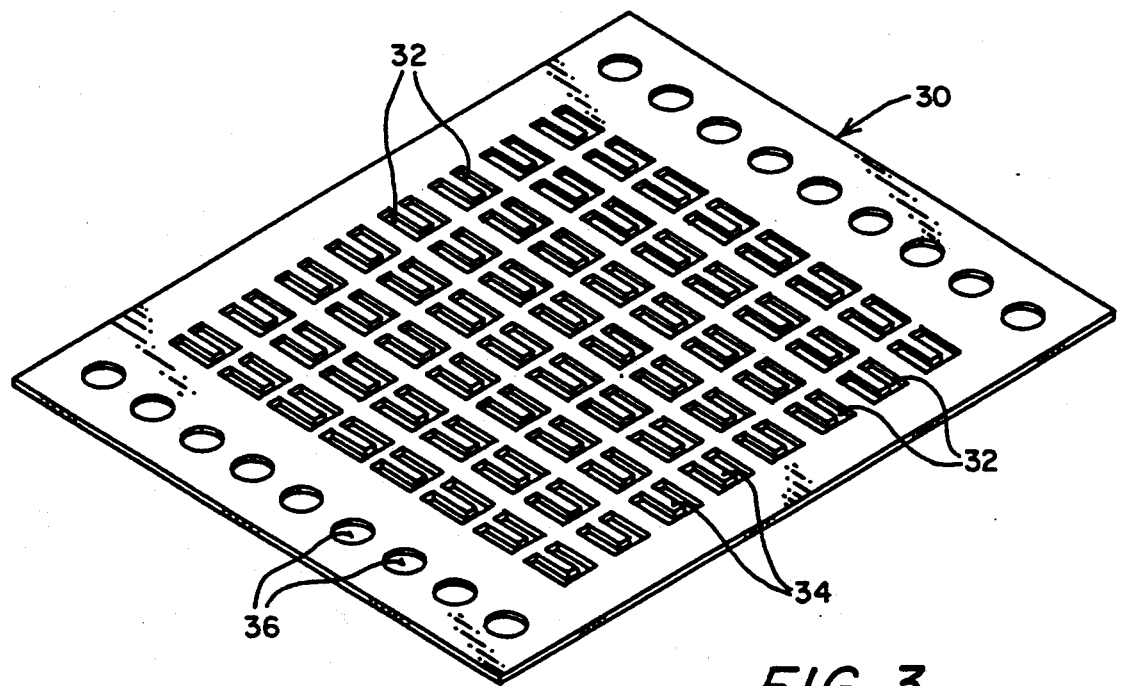
FIG. 3 is a perspective view of the sheet of FIG. 2 with a plurality of slots punched therein.

FIGS. 2–6 show a preferred process of constructing a integrated package 10 of the present invention. There is provided a sheet 30 of electrically conductive material. The sheet 30 is preferably copper, but may be constructed from any suitable material such as the material sold under the trademark KOVAR. As shown in FIG. 3, a plurality of C shaped slots 32 are formed into the sheet 30 to create a plurality of beams 34. In the preferred embodiment the slots 32 are either punched or etched from the sheet 30, although any other effective process may be employed. A number of alignment holes 36 may also be formed into the sheet 30.

Figure 4:
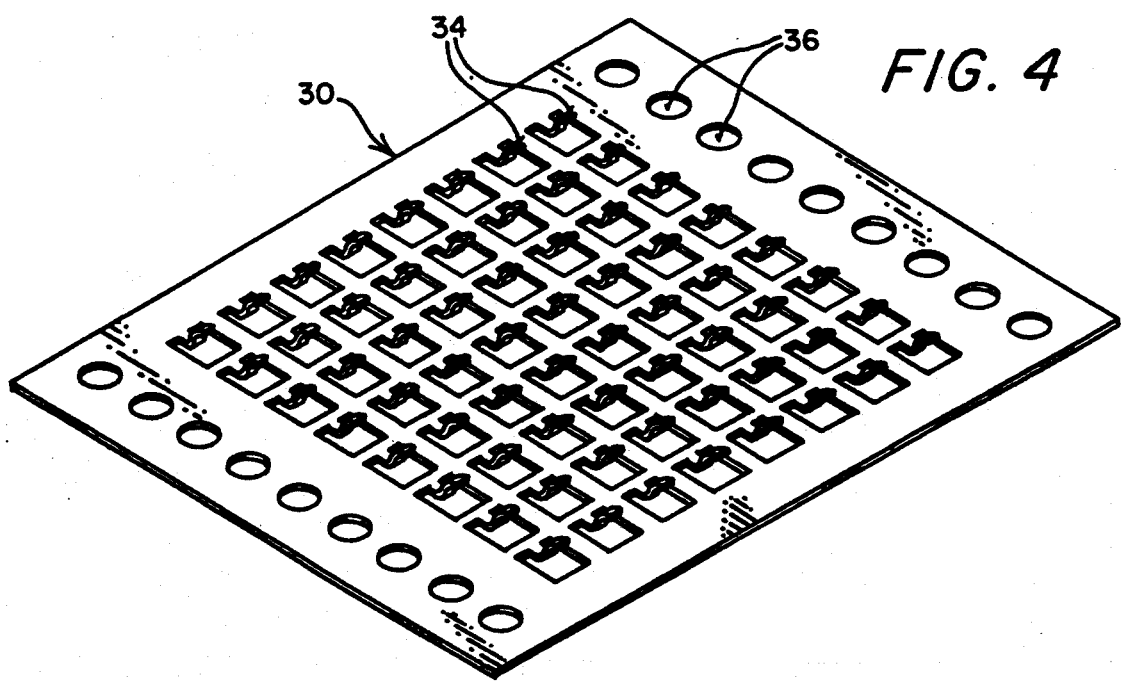
FIG. 4 is a perspective view of the sheet of FIG. 3 with beams bent in an outward direction.
Figure 5:
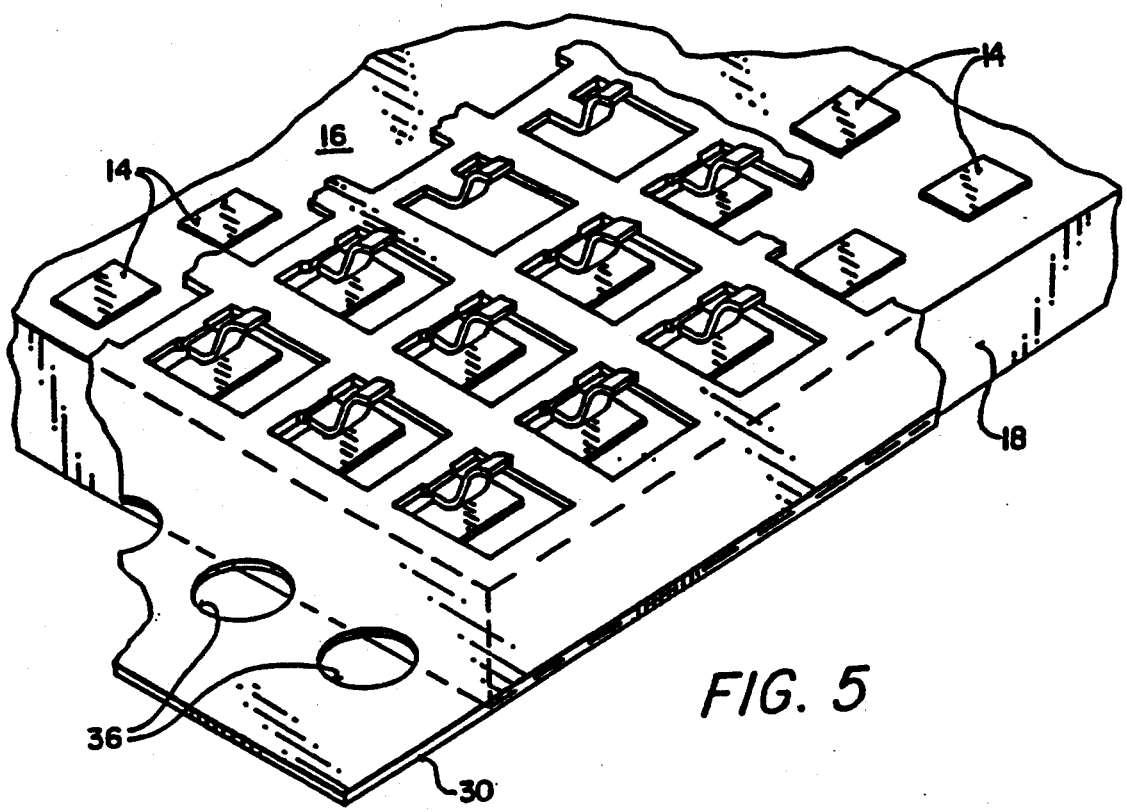
FIG. 5 is a perspective view of the sheet of FIG. 4 being placed on an integrated circuit package having a two dimensional array of contact pads.

The beams 34 are bent away from the sheet 30 into the S shapes shown in FIG. 4. The beams 34 can be bent by pressing a die (not shown) into the sheet 30 to form the desired shape. As shown in FIG. 5, the sheet and bent beams are then placed on a module 18 that has a plurality of contact pads 14. The package may also have alignment studs 38 attached to the corners of the module 18. The alignment studs 38 extend through the alignment holes 36 of the sheet to align the beams 34 with the contact pads 14. The studs 38 can also be used to align the integrated package 10 with the printed circuit board 22 described above. The base of the beams 34 are attached to the contact pads 14 using a known attachment method, including but not limited to soldering, brazing or thermal compression. After attachment, the beams 34 can be further plated or metalized. For example, the beams 34 may be dipped in a solder that will be reflowed when the package 10 is mounted to the circuit board 22.

Figure 6:
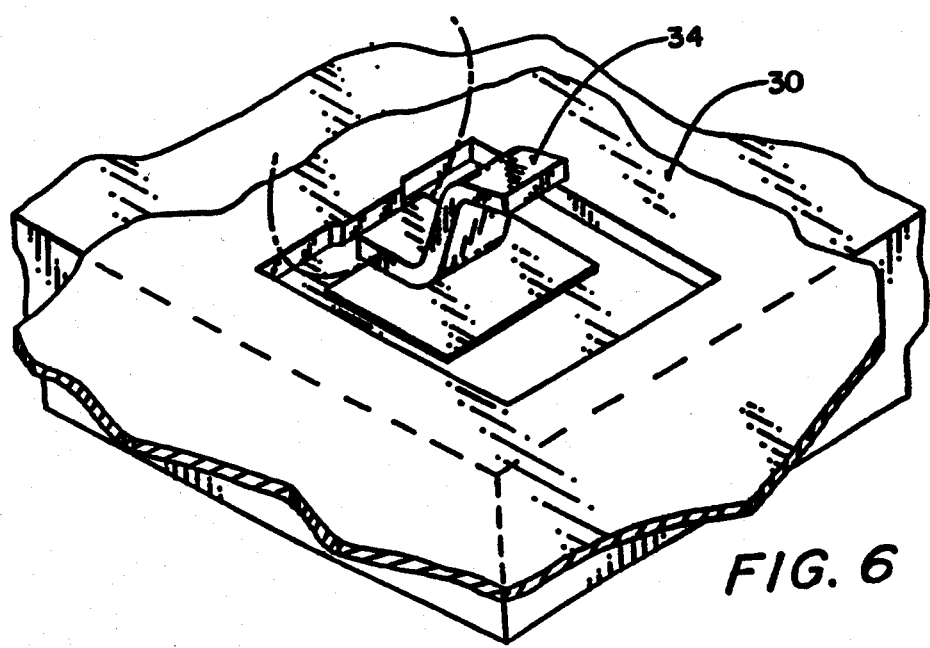
FIG. 6 is a perspective view showing the beams being cut from the sheet.

As shown in FIG. 6, the beams 34 are then cut away from the sheet 30. The beams 34 may be cut with a laser or other cutting means known in the art. After all of the beams are cut, the sheet is removed, wherein there is constructed an integrated circuit package 10 having a two dimensional array of bent leads 20. The studs 38 may also be removed if they are not desired in the final package assembly.

Figure 7:
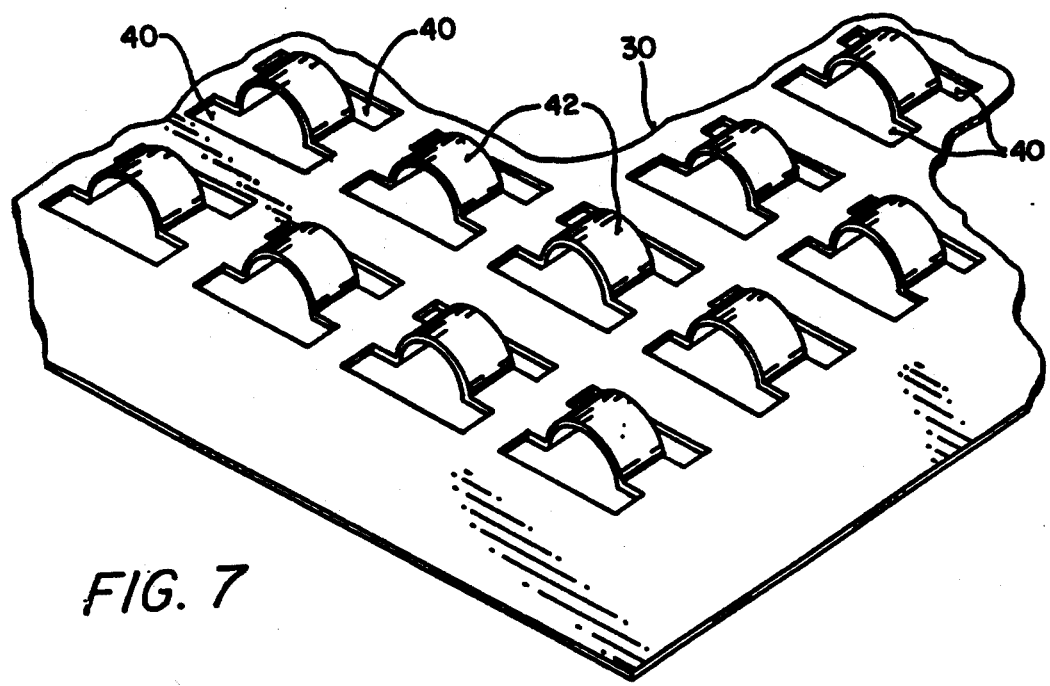
FIG. 7 is a perspective view showing an alternate embodiment of the sheet, wherein there are a plurality of beams shaped as a segment of a cylinder.
Figure 8:
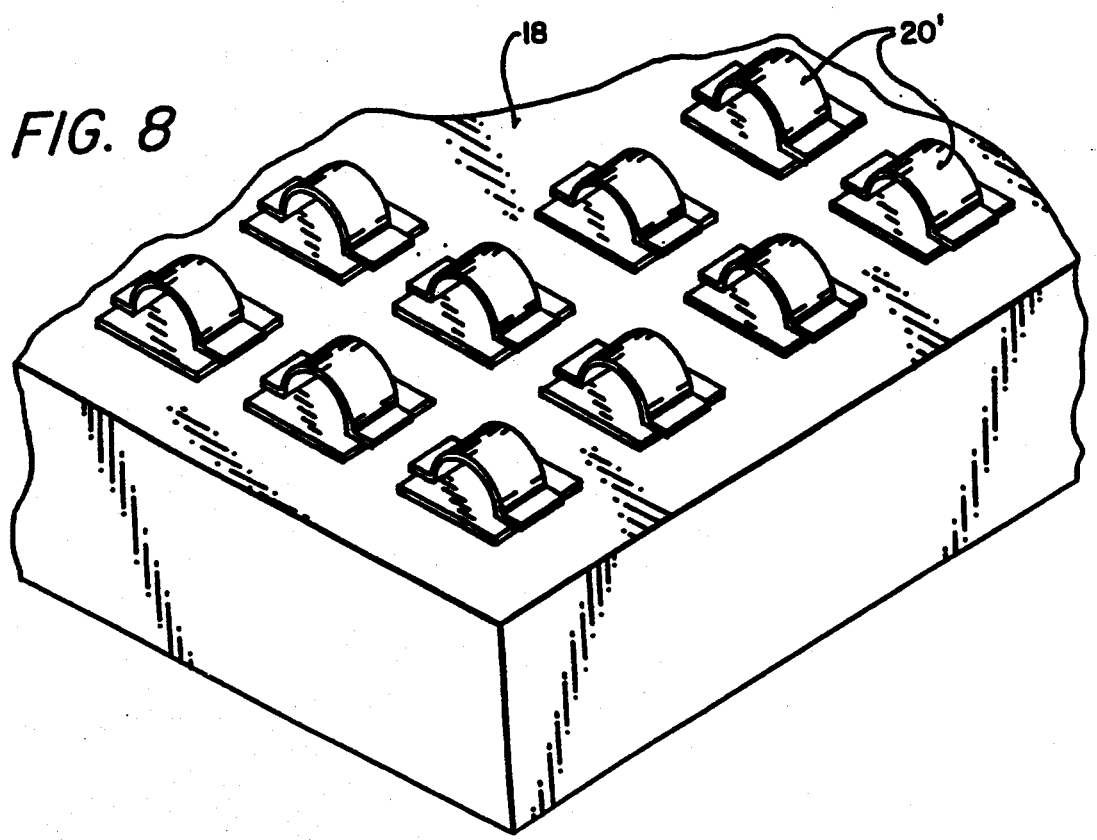
FIG. 8 is a perspective view showing the beams of FIG. 7 attached to a package.

FIG. 7 shows an alternate embodiment of the present invention. Instead of the C shaped slots, pairs of slots 40 are formed in the sheet 30 and the beams 42 are bent into a segment of a sphere. One end of each beam 42 is attached to the contact pads 14, the other end of the beam is left unattached. Both ends of each beam 42 are then cut, to separate the sheet 30 from the beams. As shown in FIG. 8, the sheet 30 is then removed from the module 18, wherein there is created a integrated circuit package 10 with a plurality of radial leads 20'. The radial leads 20' will deflect when mounted onto the circuit board 22, thus insuring contact between the leads 20' and surface pads 24 during the soldering process. The radial shape also provides stress relief for the solder joints and leads 20'.

While certain exemplary embodiments have been described in detail and shown in the accompanying drawings, it is to be understood that such embodiments are merely illustrative of and not restrictive on the broad invention, and that this invention not be limited to the specific arrangements and constructions described and shown, since various other modifications may occur to those ordinarily skilled in the art.

What is claimed is:

1. An integrated circuit package adapted to be coupled to a printed circuit board which has a mounting surface, comprising:

a module having a plurality of contact pads on a first surface of said module that faces the mounting surface of the printed circuit board when said module is coupled to the printed circuit board, each of said contact pads having a first edge and an opposite second edge; and, a plurality of leads, each of said leads having a first end that is attached to said first edge of one of said contact pads, an arcuate shaped foot portion which extends from said first end across one of said contact pads and a second end that is not attached to one of said contact pads but is adjacent to said second edge of one of said contact pad such that said second end of each of said leads comes into contact with one of said contact pads when said module is pressed onto the printed circuit board.

2. The package as recited in claim 1, wherein said contact pads and leads are arranged in a two dimensional array along said first surface.

3. The package as recited in claim 2, wherein said module has at least two alignment studs extending from said first surface.

UNITED STATES PATENT AND TRADEMARK OFFICE
CERTIFICATE OF CORRECTION

PATENT NO.   :   5,420,461
DATED   :   May 30, 1995
INVENTOR(S)   :   Mallik et al.

It is certified that error appears in the above-identified patent and that said Letters Patent is hereby corrected as shown below:

In column 1 at line 16 delete "(Its)" and insert --(ICs)--

In column 4 at line 51 delete "pad" and insert --pads--

Signed and Sealed this

Seventeenth Day of June, 1997

Attest:

BRUCE LEHMAN

Attesting Officer

Commissioner of Patents and Trademarks